United States Patent
Versen et al.

(10) Patent No.: US 7,308,624 B2
(45) Date of Patent: Dec. 11, 2007

(54) VOLTAGE MONITORING TEST MODE AND TEST ADAPTER

(75) Inventors: Martin Versen, Munich (DE); Daewon Lee, South Burlington, VT (US)

(73) Assignees: Infineon Technologies North America Corp., San Jose, CA (US); Infineon Technologies AG, Munich (DE)

( * ) Notice: Subject to any disclaimer, the term of this patent is extended or adjusted under 35 U.S.C. 154(b) by 175 days.

(21) Appl. No.: 11/116,875

(22) Filed: Apr. 28, 2005

(65) Prior Publication Data

US 2006/0248413 A1    Nov. 2, 2006

(51) Int. Cl.
*G11C 29/00* (2006.01)

(52) U.S. Cl. .................. 714/718; 714/5; 714/25; 714/42; 714/734; 365/201

(58) Field of Classification Search .............. None
See application file for complete search history.

(56) References Cited

U.S. PATENT DOCUMENTS

| | | | | |
|---|---|---|---|---|
| 5,796,746 A * | 8/1998 | Farnworth et al. | .......... | 714/718 |
| 5,877,648 A * | 3/1999 | Suzuki | .......... | 327/401 |
| 5,963,500 A * | 10/1999 | Taura et al. | .......... | 365/230.06 |
| 6,311,303 B1 * | 10/2001 | Gates et al. | .......... | 714/734 |
| 6,618,304 B2 * | 9/2003 | Duesman | .......... | 365/201 |
| 6,782,336 B2 * | 8/2004 | Shah | .......... | 702/118 |
| 6,819,129 B2 * | 11/2004 | Kim et al. | .......... | 324/755 |
| 6,836,440 B2 | 12/2004 | Adler et al. | | |
| 6,862,234 B2 | 3/2005 | Versen et al. | | |
| 7,009,417 B2 * | 3/2006 | Perner | .......... | 324/763 |
| 2003/0014702 A1 * | 1/2003 | Finteis | .......... | 714/718 |
| 2003/0028342 A1 | 2/2003 | Adler et al. | | |
| 2003/0115528 A1 * | 6/2003 | Tanaka et al. | .......... | 714/742 |
| 2005/0216809 A1 * | 9/2005 | Kim et al. | .......... | 714/738 |
| 2006/0236170 A1 * | 10/2006 | Martin et al. | .......... | 714/724 |

* cited by examiner

*Primary Examiner*—Cynthia Britt
*Assistant Examiner*—John P Trimmings
(74) *Attorney, Agent, or Firm*—Dicke, Billig & Czaja, PLLC

(57) ABSTRACT

A testing system has a processor, a module and at least one manufactured semiconductor device. The processor is configured to send and receive testing signals. The module is electrically coupled to the processor. The at least one manufactured semiconductor device is mounted on the module, and the semiconductor device has a plurality of pins at least one of which is a non-functional pin. The system is configured to provide the processor access to the semiconductor device. An external device monitors voltage at the non-functional pin of the semiconductor device.

7 Claims, 2 Drawing Sheets

VOLTAGE MONITORING TEST MODE AND TEST ADAPTER

BACKGROUND

The present invention relates to an apparatus and method for testing a memory circuit. More particularly, the invention relates to a test adapter for monitoring internal voltage of a memory component.

After integrated dynamic memory circuits have been fabricated, these memory circuits are tested in order to determine their functionality and any potential defects. Often, this testing is specific to the applications indicated for the particular memory circuit under test. Typically, identified defects may generally be repaired by replacing memory areas that are affected by the defect.

Generally, the functionality of memory components is guaranteed by design and by tests made during the production of the components. The components themselves, and the tests thereon, are designed specifically for a particular application of the memory component. Typically, memory components are tested in test systems using probe cards to facilitate internal measurements of the memory component. The pins of the memory components interface with contacts on the probe cards which are then used in the test system.

Memory component functionality may be tested in a test mode or in an application mode. A test mode test certain targeted functionality and an application mode tests that actual application for which the component is to be used. Some pins that are used for monitoring component functionality during test modes cannot be used for monitoring during an application because these pins have a functional use during the application mode.

For these and other reasons, there is a need for the present invention.

SUMMARY

One aspect of the present invention provides a testing system for testing a semiconductor device. The testing system includes a processor, a module and at least one manufactured semiconductor device. The processor is configured to send and receive testing signals. The module is electrically coupled to the processor. The at least one manufactured semiconductor device is mounted on the module, and the semiconductor device has a plurality of pins at least one of which is a non-functional pin. The system is configured to provide the processor access to the semiconductor device. An external device monitors voltage at the non-functional pin of the semiconductor device.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated, as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
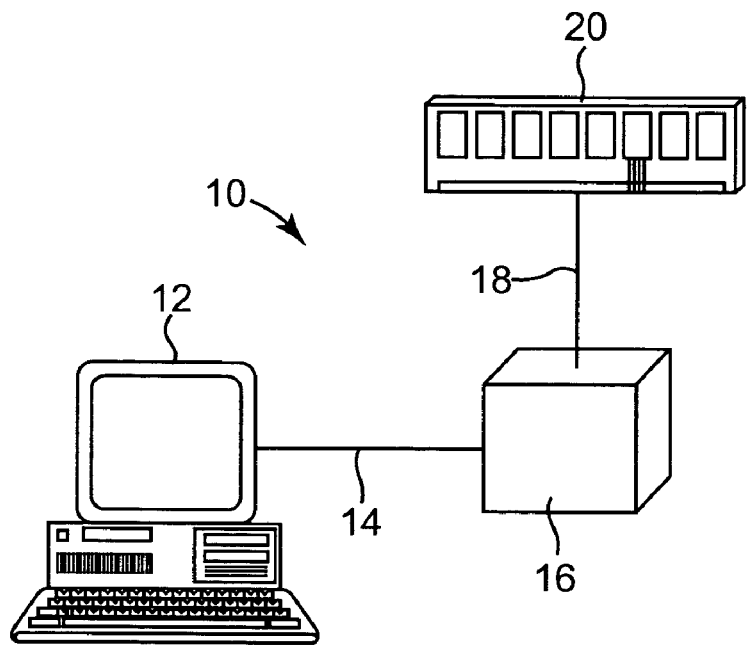
FIG. 1 illustrates a testing system for memory components.

FIG. 1 illustrates memory testing system 10. Testing system 10 includes testing processor 12, testing adapter 16, and testing module 20. Testing module 20 is coupled to testing adapter 16 by line 18 and testing adapter 16 is coupled to testing processor 12 by line 14. Although lines 14 and 16 are illustrated with single lines, one skilled in the art will recognize that multiple communication lines are typically used between the various devices coupled with these lines.

In operation testing system 10 is utilized to verify the functionality of memory components coupled to testing module 20. In one embodiment, testing processor 12 is programmed with various test algorithms, which are then run on memory components mounted in testing module 20. Testing processor 12 has various test modes as well as application modes. Routing of test signals from testing processor 12 to memory components on testing module 20 may be facilitated by testing adapter 16, which is in a variety of forms from application to application. In one example, testing adapter 16 is an adapter card. Test modes are applied to memory components on testing module 20 by testing adapter 16.

Figure 2:
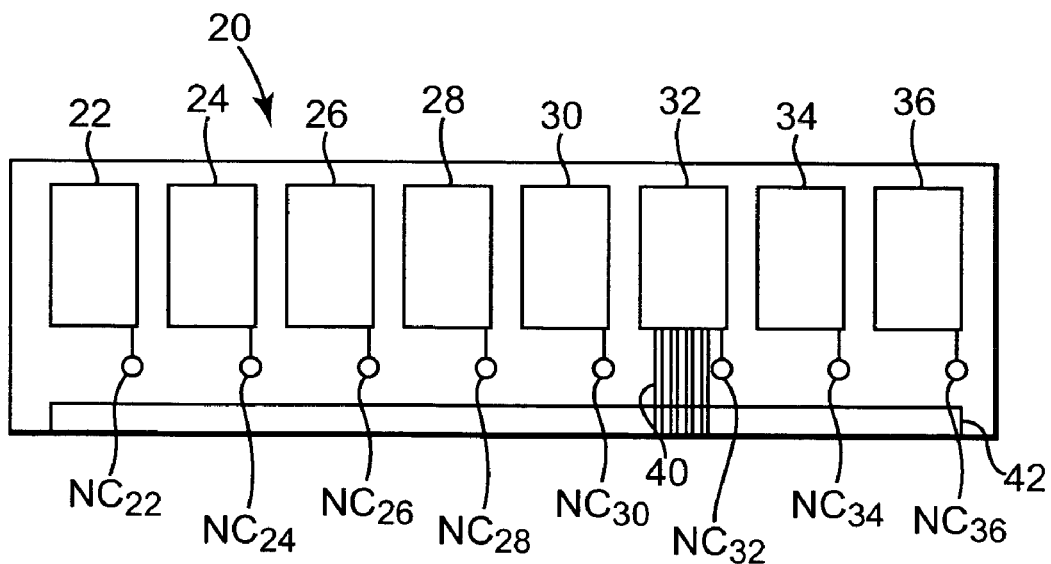
FIG. 2 illustrates memory components mounted on a testing module in accordance with one embodiment of the present invention.

FIG. 2 illustrates an enlarged plan view of testing module 20 from FIG. 1. Testing module 20 includes first memory component 22, second memory component memory component 24, third memory component 26, fourth memory component 28, fifth memory component 30, sixth memory component 32, seventh memory component 34, and eight memory component 36. In the illustrated embodiment there are eight memory components, however, one skilled in the art will understand that a variety of numbers of components can be so mounted. For example, testing system 10 can be configured to test 16, 32, 64 or some other number of memory components mounted in testing module 20.

Module 20 includes contact lines to couple functional signal pins from first through eighth memory components 22-36 to module edge connector 42. For example, in FIG. 2 data contact lines 40 are illustrated coupled between sixth memory component 32 and module edge connector 42. The other memory components 22-30 and 34-36 similarly have data contact lines, and other signal-connect lines, but these have been omitted in FIG. 2 to simplify the illustration. Edge connector 42 has hundreds of connector lines in many embodiments, but for simplicity, they are not illustrated.

In this way, a variety of signals from the plurality of functional pins on memory components 22-36 are in communication with module edge connector 42. Module edge connection 42 is then coupled to other components of a testing system, such as to testing processor 12 in FIG. 1, to facilitate communication between the testing processor of the testing system and various memory components 22 through 36.

In one embodiment, additional contacts are provided to each of memory components 22-36. In one embodiment, each of memory components 22-36 has at least one pin that is not connected to edge connection 42. In this way, this "not-connected" pin is not a functional pin, that is, it is not utilized in applications for which memory components 22-36 are designed. Such pins are often referred to as an NC (not connected) pin. In accordance with one embodiment of the present invention, module 20 is provided with a probe point for each of the NC pins of memory components 22-36. Probe points $NC_{22}$-$NC_{36}$ are respectively coupled to the NC pin of memory components 22-36.

In one embodiment, testing module 20 is coupled to a testing processor, such as testing processor 12 in FIG. 1, such that internal measurements may be made of memory components 22-36. In this way, various test modes can be used to test the functionality of memory components 22-36. In one embodiment, these test modes are introduced via testing adapter 16 from FIG. 1. In these test modes, internal voltages of memory components 22-36 are monitored. In some cases, such internal voltages can be monitored on a functional pin of memory components, such as on certain functional pins in DDR or DDR2 products that are not otherwise used in the test modes. In these types of tests, an internal voltage of memory components 22-36 may be monitored and provide useful information about the functionality of the memory components 22-36.

There are, however, conditions under which these functional pins can not be used for monitoring internal voltages. For example, such functional pins cannot be used when the testing processor runs an application mode. When an actual application for which memory components 22-36 are designed are run on memory components 22-36, functional pins are used for those applications. In other words, those functional pins are driven with running the application. In this way, because these functional pins have actual functionality and are used for other purposes in an application mode, they cannot also be used to monitor internal voltage measurements at the same time.

Consequently, one embodiment of the present invention allows utilization of probe points $NC_{22}$-$NC_{36}$ for monitoring internal voltage measurements of memory components 22-36 via the respective NC pins of each of the memory components to which the probe points $NC_{22}$-$NC_{36}$ are electrically connected. Probe points $NC_{22}$-$NC_{36}$ allow monitoring of the internal voltage of memory components 22-36 not only during various test modes, but also in an application environment. An oscilloscope or volt meter may be used to measure the internal signals from the memory components at probe points $NC_{22}$-$NC_{36}$.

Even where a testing system is using application modes that drive or otherwise occupy the other pins of memory components 22-36, testing module 20 affords access to the NC pins of memory components 22-36. In this way, a testing system has access to probe points $NC_{22}$-$NC_{36}$ such that each individual memory component 22-36 may be monitored at its NC pin so that the internal voltage for that particular component may be observed during testing, either within a testing mode or an application mode. Since the NC pin of each of memory components 22-36 is not driven or otherwise occupied with running the application driven (like the functional pins are), the NC pin can be monitored to access the internal voltage of the memory components 22-36.

For example, in one embodiment internal voltages in memory components 22-36 are monitored during testing modes and also in an application environment. Since NC pins in memory components 22-36 are not otherwise used or connected for any other purpose in the application, they can be used to observe internal voltage during testing.

Figure 3:
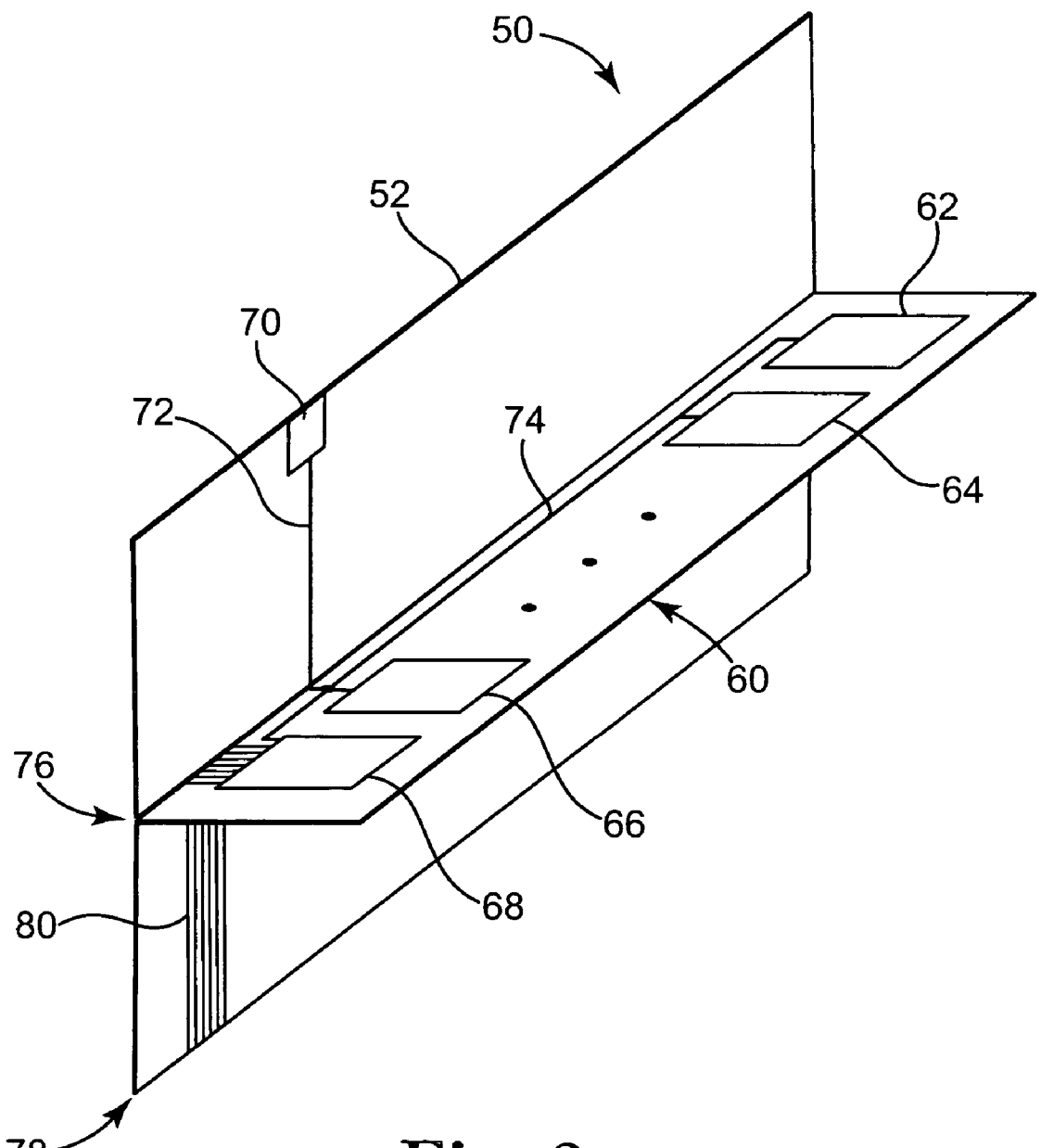
FIG. 3 illustrates memory components mounted on a memory module and adapter card in accordance with one embodiment of the present invention.

FIG. 3 illustrates testing module 50 in accordance with another embodiment of the present invention. Testing module 50 includes adapter card 52 and component module 60. Component module 60 is illustrated carrying first memory component 62, second memory component 64, third memory component 66, and fourth memory component 68. As illustrated, just like module 20 in FIG. 2, additional memory components can be mounted to component module 60 in accordance with other embodiments of the present invention. In some embodiments, 12, 24, 36 and other combinations of memory components are carried on component module 60, but only first through fourth memory components 62-68 are illustrated in FIG. 3 for simplicity of illustration.

Component module 60 is coupled to adapter card 52 via edge connector 76. Adapter card 52 may then be coupled to a testing processor within a testing system, such as testing processor 12 in FIG. 1, via system connector 78. As with previously-described memory components, memory components 62-68 each have functional signal pins, and these signal pins are typically edge connector 76, and then coupled to the testing system, or the testing processor of the testing system, via a memory bus. For example, functional signal pins on data fourth memory component 68 are illustrated coupled to system connector 78 via memory bus 80. The signal pins of the remaining memory components 62-66 may similarly be connected, but for simplicity of illustration only memory bus 80 is illustrated.

In addition to such functional signal pins, memory components 62-68 are also each configured with non-functional pins that are not connected to edge connector 76, and thus not connected to adapter card 52 or a testing processor. Such not-connected pins or NC pins are not involved in the functional aspects for which memory components 62-68 are designed. In one embodiment, however, each NC pin for each of memory components 62-68 is coupled to each other via a NC connector bus 74. NC connector bus 74 is then coupled to NC test pad 70 on adapter card 52 via NC contact line 72.

In operation of one embodiment of the present invention, testing module 50 is coupled to a testing processor, such as testing processor 12 illustrated in testing system 10 of FIG. 1. Testing processor 12 then communicates with the various functional signal pins of each of memory components 62-68 via a memory bus, such as memory bus 80, coupled between the system connector 78 and each of memory components 62-68. In this way, various test modes and functional application modes can be run on the individual memory components 62-68 via the testing adapter.

In one embodiment, memory components 62-68 are controllably selected such that NC test pad 70 is monitored to determine internal voltage measurements for a selected memory component. For example, when first memory component 62 is selected or enabled, any voltage at its NC pin is accessed by monitoring NC test pad 70, which is coupled to the NC pin of the memory components 62-68 via NC connect line 72 and NC connection bus 74. By individually cycling through and individually selecting each of memory components 62-68, the particular NC pin for any of memory components 62-68 can be accessed via NC test pad 70. In one embodiment, an oscilloscope or volt meter is used to measure the internal signals from the memory components at NC test pad 70.

In another embodiment, additional NC test pads are added to adapter card 52 and then individually coupled to the NC pin of each of the memory components 62-68 on the component module 60. In this way, each individual memory component 62-68 may be monitored at a test pad uniquely coupled to one NC pin of one memory component 62-68. Thus, the internal voltage for that particular component may be observed during testing. Again, these NC pins are not connected with the functional aspects of memory component 62-68 such that they are not driven in the application mode and are thus usable to monitor internal voltage.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A tester apparatus comprising:
    a memory module;
    a plurality of semiconductor random access memory devices coupled to the memory module, wherein each of the semiconductor random access memory devices have a non-functional pin;
    the memory module further including connection lines coupled to the not-connected pin of each of the plurality of semiconductor random access memory devices such that voltage at each of the non-functional pins may be monitored at the connection lines of the memory module; and
    a test pad, wherein each of the connection lines are configured to couple the non-functional pins of each of the plurality of semiconductor random access memory devices to the test pad.

2. The tester apparatus of claim 1, wherein the test pad is configured such that voltage at each of the non-functional pins may be alternately monitored at the test pad.

3. A memory testing system comprising:
    a processor configured to send and receive testing signals;
    an adapter card coupled to the processor and configured to exchange signals with the processor;
    a memory module coupled to the adapter card and configured to exchange signals with the adapter card;
    a plurality of semiconductor memory devices mounted on the memory module, the semiconductor memory devices each having a plurality of functional pins and at least one non-functional pin; and
    a test pad on the adapter card and coupled to the non-functional pin of each of the semiconductor memory devices for monitoring the voltage at the non-functional pins.

4. The memory testing system of claim 3, wherein the adapter card and memory module further comprise connection lines coupling the non-functional pins of each of the plurality of semiconductor memory devices to the test pad.

5. The memory testing system of claim 4, wherein the processor controls each of the plurality of semiconductor memory devices such that the voltage at the non-functional pins may be made selectively available at the test pad.

6. A method of testing a semiconductor memory device, the method comprising:
    providing an adapter card;
    coupling a memory module to the adapter card such that it is electrically coupled therewith;
    mounting a plurality of semiconductor memory devices on the memory module, the semiconductor memory devices each having a plurality of pins at least one of which is a non-functional pin;
    running an application test on the plurality of semiconductor memory devices, including driving some of the plurality of pins, but not driving the non-functional pin; and
    monitoring voltage at a test pad on the adapter card, the test pad being coupled to the non-functional pin of each of the semiconductor memory devices.

7. The method of claim 6, further comprising selectively enabling one of the plurality of semiconductor memory devices such that the voltage monitored at the test pad is the voltage of the non-functional pin on the selected semiconductor memory device.

* * * * *